US006530049B1

(12) United States Patent
Abramovici et al.

(10) Patent No.: US 6,530,049 B1
(45) Date of Patent: Mar. 4, 2003

(54) ON-LINE FAULT TOLERANT OPERATION VIA INCREMENTAL RECONFIGURATION OF FIELD PROGRAMMABLE GATE ARRAYS

(75) Inventors: Miron Abramovici, Berkeley Heights, NJ (US); Charles E. Stroud, Lexington, KY (US); John M. Emmert, Lexington, KY (US)

(73) Assignees: Lattice Semiconductor Corporation, Hillsboro, OR (US); U. of Kentucky, Research Foundation, Lexington, KY (US)

( * ) Notice: Subject to any disclaimer, the term of this patent is extended or adjusted under 35 U.S.C. 154(b) by 447 days.

(21) Appl. No.: 09/611,449

(22) Filed: Jul. 6, 2000

(51) Int. Cl.$^7$ ............................................... G01R 31/28
(52) U.S. Cl. ........................................................ 714/725
(58) Field of Search ................................ 714/725, 718, 714/723, 719, 738, 710, 711; 365/200, 201

(56) References Cited

U.S. PATENT DOCUMENTS

| | | |
|---|---|---|
| 4,414,669 A | 11/1983 | Heckelman et al. |
| 4,757,503 A | 7/1988 | Hayes et al. |
| 4,817,093 A | 3/1989 | Jacobs et al. |
| 5,051,996 A | 9/1991 | Bergeson et al. |
| 5,081,297 A | 1/1992 | Lebel et al. |
| 5,090,015 A | 2/1992 | Dabbish et al. |
| 5,107,208 A | 4/1992 | Lee |
| 5,179,561 A | 1/1993 | Izawa et al. |
| RE34,445 E | 11/1993 | Hayes et al. |
| 5,260,946 A | 11/1993 | Nunally |

(List continued on next page.)

OTHER PUBLICATIONS

M. Abramovici et al., "Using Roving STARs for On–Line Testing and Diagnosis of FPGAs in Fault–Tolerant Applications," Proc. IEEE Intn'l. Test Conf., pp. 973–982, 1999.

R. Cuddapah et al., "Reconfigurable Logic for Fault Tolerance," Springer–Verlag, 1995 pp. 380–383, 386–388.
S. Durand et al., "FPGAs with Self–Repair Capabilities," Proc. ACM Int'l Workshop on FPGAs, pp. 1–6, 1994.

(List continued on next page.)

Primary Examiner—Christine T. Tu

(57) ABSTRACT

A method of fault tolerant operation of field programmable gate arrays (FPGAs) utilizing incremental reconfiguration during normal on-line operation includes configuring an FPGA into initial self-testing areas and a working area. Within the self-testing areas, programmable logic blocks (PLBs) of the FPGA are tested for faults. Upon the detection of one or more faults within the PLBs, the faulty PLBs are isolated and their modes of operation exhaustively tested. Partially faulty PLBs are allowed to continue operation in a diminished capacity as long as the faulty modes of operation do not prevent the PLBs from performing non-faulty system functions. After testing the programmable logic blocks in the initial self-testing areas, the FPGA is reconfigured such that a portion of the working area becomes a subsequent self-testing area and at least a portion of the initial self-testing area replaces that portion of the working area. In other words, the self-testing area roves around the FPGA repeating the steps of testing and reconfiguring until the entire FPGA has undergone testing, or continuously. Prior to relocating the initial self-testing areas, the initial self-testing areas are reconfigured to replace unusable faulty PLBs with spare PLBs. Spare PLBs are initially allocated throughout the working area. Specifically, each operational PLB within the working area is allocated an adjacent preferred spare PLB. Predetermined configurations of the FPGA utilizing the preferred spares are used to avoid the faulty PLBs. If the initially allocated spares are incapable of utilization, then a subsequent portion of the PLBs within the working area are allocated as spares and new replacement configurations determined. As the number of spare PLBs is diminished over time, additional spare PLBs are at some point necessarily removed from the self-testing areas. In this manner, the testing and roving capabilities of the self-testing area are also inevitably diminished. Eventually, roving, testing, and even operation of the FPGA will cease.

26 Claims, 4 Drawing Sheets-

U.S. PATENT DOCUMENTS

| | | | |
|---|---|---|---|
| 5,278,841 | A | 1/1994 | Myers |
| 5,347,519 | A | 9/1994 | Cooke et al. |
| 5,361,264 | A | 11/1994 | Lewis |
| 5,425,036 | A | 6/1995 | Liu et al. |
| 5,430,734 | A | 7/1995 | Gilson |
| 5,432,797 | A * | 7/1995 | Takano ................... 714/718 |
| 5,475,624 | A | 12/1995 | West |
| 5,488,612 | A | 1/1996 | Heybruck |
| 5,508,636 | A | 4/1996 | Mange et al. |
| 5,623,501 | A | 4/1997 | Cooke et al. |
| 5,867,507 | A | 2/1999 | Beebe et al. |
| 6,065,141 | A * | 5/2000 | Kitagawa ................. 714/711 |

OTHER PUBLICATIONS

S. Dutt et al., "REMOD: A New Methodology for Designing Fault–Tolerant Arithmetic Circuits," IEEE Trans. on VLSI Systems, vol. 5, pp. 34–56, 1997.

J. Emmert et al., "Partial Reconfiguration of FPGA Mapped Designs with Applications to Fault Tolerance and Yield Enhancement," Lecture Notes on Comp. Sci., vol. 1304, pp. 141–150, 1997.

J. Emmert et al., "Incremental Routing in FPGAs," Proc. IEEE Int'l ASIC Conf., pp. 302–305, 1998.

F. Hanchek et al., "Methodologies for Tolerating Logic and Interconnect Faults in FPGAs," IEEE Trans. on Computers, pp. 15–33, Jan. 1998.

F. Hatori et al., "Introducing Redundancy in Field Programmable Gate Arrays," Proc. IEEE Custom Integrated Circuits Conf., pp. 7.7.1–7.1.4, 1993.

N. Howard et al., "The Yield Enhancement of Field Programmable Gate Arrays," IEEE Trans. on VLSI Systems, vol. 2, pp. 115–123, 1994.

J. Kelly et al., "A Novel Approach to Defect Tolerant Design for SRAM Based FPGAs," Proc. ACM Int'l Workshop on FPGAs, pp. 7–11, 1994.

V. Kumar et al., "An Approach for the Yield Enhancement of Programmable Gate Arrays," Proc. IEEE Int'l Conf. on CAD, pp. 226–229, 1989.

J. Lach et al., "Efficiently Supporting Fault Tolerance in FPGAs," Proc. ACM Int'l Symp. on FPGAs, 1998.

J. Narasimhan et al., "Yield Enhancement of Programmable ASIC Arrays by Reconfiguration of Circuit Placements," IEEE Trans. on CAD, vol. 13, No. 8, pp. 976–986, Aug. 1994.

L. Shombert et al., "Using Redundancy for Concurrent Testing and Repairing of Systolic Arrays," Proc. 17th Fault–Tolerant Computing Symp., pp. 244–249, 1987.

N. Shnidman et al., "On–Line Fault Detection for Bus–Based Field Programmable Gate Arrays," IEEE Trans. on VLSI Systems, vol. 6, pp. 656–666, Dec. 1998.

* cited by examiner

US 6,530,049 B1

ON-LINE FAULT TOLERANT OPERATION VIA INCREMENTAL RECONFIGURATION OF FIELD PROGRAMMABLE GATE ARRAYS

TECHNICAL FIELD

The present invention relates generally to the field of integrated circuit devices and, more particularly, to on-line fault tolerant operation of a field programmable gate array.

BACKGROUND OF THE INVENTION

A field programmable gate array (FPGA) is a type of integrated circuit consisting of an array of programmable logic blocks interconnected by a programmable routing network and programmable input/output cells. Programming of the logic blocks, the routing network and the input/output cells is selectively completed to make the necessary interconnections that establish one configuration thereof to provide the desired system operation/function for a particular application.

The present inventors have recently developed methods of built-in self-testing the array of programmable logic blocks and the programmable routing network in FPGAs at the device, board and system levels. These methods are set out in detail in U.S. Pat. Nos. 5,991,907 and 6,003,150 and pending U.S. application Ser. Nos. 09/059,552 and 09/109,123. The full disclosures in these patent applications are incorporated herein by reference.

In addition to these off-line testing methods, the present inventors have also recently developed methods of testing and fault tolerant operation of the programmable logic blocks and the programmable interconnect network of FPGAs. These methods are set out in detail in pending U.S. application Ser. Nos. 09/261,776, 09/405,958, 09/406,219 and U.S. Provisional Application No. 60/156,189. The full disclosures in these patent applications are also incorporated herein by reference.

Fault tolerant operation of FPGAs is most important in high-reliability and high-availability applications, such as, long-life space missions, telecommunication network routers, or remote equipment in which adaptive computing systems often rely on reconfigurable hardware to adapt system operation to environment changes. In such applications, the FPGA hardware must work continuously and simply cannot be taken off-line for testing, maintenance, or repair.

When a fault is detected in the FPGA hardware of these systems, the fault must be quickly isolated and the FPGA resources reconfigured to continue operation in a diminished capacity or to avoid the faulty resources. Therefore, testing and reconfiguring the FPGA resources, if necessary, must be performed concurrently with normal system operation in a dynamic fault tolerant manner.

SUMMARY OF THE INVENTION

In accordance with the present invention, the fault tolerant method of operating a field programmable gate array utilizing incremental reconfiguration is carried out during normal on-line operation. The FPGA resources are configured into a working area and an initial self-testing area. The working area maintains normal operation of the FPGA throughout testing. Within the initial and subsequent self-testing areas, however, the programmable logic blocks are each tested. It is initially presumed that all of the resources of the FPGA are fault-free as determined through manufacturing testing.

Within the self-testing areas, each programmable logic block including those allocated as spares is tested, preferably, exhaustively. Fault status data for each programmable logic block under test is generated and stored. In accordance with an important aspect of the present inventive method, the fault status data for each programmable logic block is used in reconfiguring the utilization of partially faulty programmable logic blocks to continue performing non-faulty system functions, or in the reconfiguration of the FPGA resources to avoid faulty programmable logic blocks altogether. By reconfiguring the utilization of partially faulty programmable logic blocks, these blocks are allowed to continue to operate in a diminished, although acceptable, capacity for specific operating modes.

Upon completion of testing of each of the programmable logic blocks located within the initial self-testing area, the FPGA is reconfigured so that a portion of the working area becomes a subsequent self-testing area, and the initial self-testing area becomes a portion of the working area. In other words, the self-testing area roves around the FPGA repeating the steps of testing the programmable logic blocks and reconfiguring the FPGA until each portion of the working area, or the entire FPGA, is reconfigured as a subsequent self-testing area, tested, and the utilization of the respective programmable logic blocks reconfigured, if need be. Advantageously, normal operation of the FPGA continues within the working area throughout testing and is uninterrupted by the testing conducted within the self-testing areas.

Prior to relocating the initial and subsequent self-testing areas, the FPGA is incrementally reconfigured to advantageously place spare programmable logic blocks. In accordance with the present inventive method, a portion of the working area programmable logic blocks are initially allocated as spares having fault tolerant replacement configurations predetermined or precompiled before the mission starts for each associated programmable logic block. Preferably, the initially allocated spares and their associated precompiled replacement configurations are utilized first in the incremental reconfiguration process, if possible.

If the number or location of unusable faulty programmable logic blocks is such that the initially allocated spares cannot replace the faulty programmable logic blocks, then a subsequent portion of the working area programmable logic blocks are allocated as spares and new fault tolerant replacement configurations computed. Although the initial precomputed replacement configurations are preferred over the new replacement configurations due to time considerations, the additional time required to reallocate subsequent spares and compute new replacement configurations does not significantly interfere with the continuing operation of the FPGA. As noted above, normal operation of the FPGA continues within the working area throughout testing.

As the self-testing area roves around the FPGA repeating the steps of testing and incrementally reconfiguring the utilization of programmable logic blocks, the number of available spare programmable logic blocks will inevitably diminish over time as unusable faulty programmable logic blocks are replaced. In accordance with another important aspect of the present invention, additional spare programmable logic blocks are at some point necessarily removed from the self-testing area. In this manner, the testing and roving capabilities of the self-testing area are also inevitably diminished. Eventually, roving, testing, and even operation of the FPGA will cease. Advantageously, however, the present inventive method of on-line fault tolerant operation utilizing incremental reconfiguration delays the need for real-time replacement configurations, and subsequently the use of programmable logic blocks from the self-testing area as spares as long as possible while allowing normal operation of the FPGA to continue within the working area.

BRIEF DESCRIPTION OF THE DRAWINGS

The accompanying drawings incorporated in and forming a part of the specification, illustrate several aspects of the present invention and together with the description serve to explain the principles of the invention. In addition, the principles of the invention are set forth in a publication, incorporated herein by reference, entitled "Dynamic Fault Tolerance in FPGAs via Partial Reconfiguration" published in "2000 IEEE Symposium on Field-programmable Customer Machines: Proceedings: Apr. 17–19, 2000 Napa Valley, Calif." In the drawings.

Reference will now be made in detail to the present preferred embodiment of the invention, an example of which is illustrated in the accompanying drawings.

DETAILED DESCRIPTION OF THE INVENTION

A typical field programmable gate array (FPGA) generally consists of an array of programmable logic blocks interconnected by a programmable routing network and programmable input/output cells or boundary-scan ports (most FPGAs feature a boundary-scan mechanism). Such structures are, for example, featured in the Lucent ORCA programmable logic function units, in the Xilinx XC4000 configurable logic block, and in the ALTERA FLEX 8000 logic element. In accordance with the present invention, the fault tolerant method of operating an FPGA utilizing incremental reconfiguration is carried out during normal on-line operation.

Figure 1:
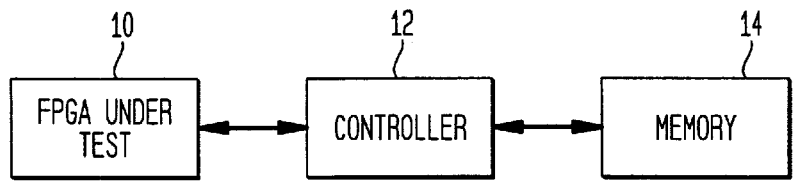
FIG. 1 is a schematic block diagram of an apparatus for testing and incrementally reconfiguring a field programmable gate array for fault tolerant on-line operation.

As shown in schematic block diagram in FIG. 1, the fault tolerant operation and incremental reconfiguration of an FPGA under test 10 are preferably controlled by a test and reconfiguration controller 12. In the preferred embodiment, an external test and reconfiguration controller 12 is utilized because present commercially available FPGAs do not allow internal access to their configuration memory. Accordingly, a configuration decompiler tool of a type known in the art is utilized to determine the intended function or mode of operation of the FPGA resources for use by the controller 12. Alternatively, this information may be extracted from the design stage and made available to the controller 12. It should be appreciated by those skilled in the art that any controller (e.g., internal or external to the FPGA) could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

The preferred controller 12 may be implemented on an embedded microprocessor in communication with a storage medium or memory 14 for storing the various FPGA operational configurations and partial configurations, as well as, test, diagnosis, and fault-tolerant functions including their associated fault-tolerant replacement configurations. In operation, the controller 12 accesses the system platform including the FPGA under test 10 in a known manner such that access is transparent to the normal function of the FPGA under test 10.

Advantageously, this approach allows for complete testing and incremental reconfiguration for fault tolerant operation during normal on-line operation of the FPGA 10 under test. The controller 12 and memory 14 further exchange and store usage status data (e.g., functional status, unused spare status or spare status) used in testing and fault status data (e.g., fault-free status, defective status or partially usable status) for each programmable logic block (PLB) tested. These data are subsequently utilized in reconfiguring the allowable functions of partially faulty PLBs and in incrementally reconfiguring the FPGA under test 10 to avoid unusable faulty PLBs. The utilization of the usage and fault status data is further described in more detail below.

Figure 2:
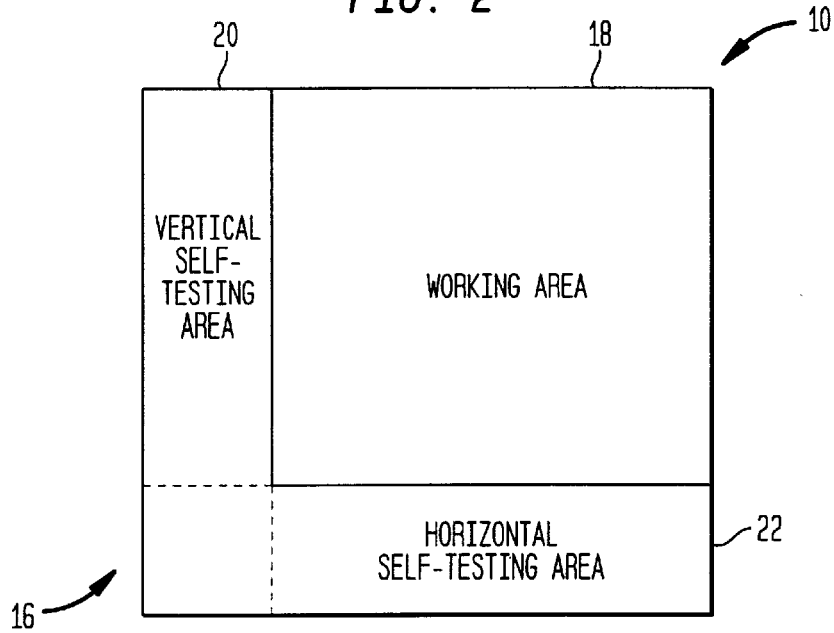
FIG. 2 is an illustration of an FPGA under test configured into initial vertical and horizontal self-testing areas, and a working area wherein normal operation of the FPGA under test continues throughout testing.

As shown in FIG. 2, the FPGA under test 10 is initially configured by the controller 12 into an initial self-testing area 16 and a working area 18. As previously indicated, normal operation of the FPGA under test 10 is maintained within the working area 18 throughout testing. In accordance with the present preferred method, the initial self-testing area 16 includes a vertical self-testing area 20 and a horizontal self-testing area 22. Throughout testing, the vertical self-testing area 20 and the horizontal self-testing area 22 intermittently rove around the FPGA under test 10. While only one self-testing area is required to test PLBs, both self-testing areas 20 and 22 are required for testing the programmable routing network of the FPGA under test 10, if desired.

Figure 3:
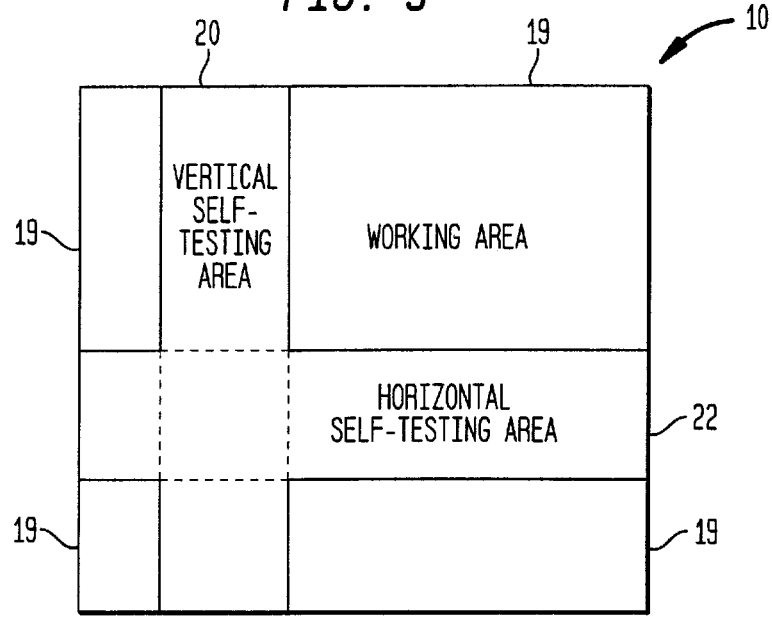
FIG. 3 is an illustration of the FPGA under test wherein the working area is divided into four disjoint areas by subsequent vertical and horizontal self-testing areas.

Depending upon the location of the two self-testing areas 20 and 22 at any given time during testing, the working area 18 may be contiguous, or it may be divided into two or four disjoint regions 19 as shown in FIG. 3. To accommodate the testing of PLBs in the self-testing areas 20 and 22, vertical wire segments in the vertical self-testing area 20 and horizontal wire segments in the horizontal self-testing area 22 are all designated reserved or unusable during operation of the FPGA under test 10. In this manner, connections between PLBs in the disjoint regions 19 of the working area 18 may be made utilizing horizontal wire segments through the vertical self-testing area 20 and vertical wire segments through the horizontal self-testing area 22.

Within the initial self-testing areas 20 and 22, the PLBs (not shown for clarity) are each exhaustively tested. Fault status data for each PLB under test is generated as a function of a result of the tests. Advantageously, this type of exhaustive testing of the PLBs results in maximum fault coverage without the need for explicit fault model assumptions. Therefore, the present preferred method of testing the PLBs of an FPGA is certain to detect all faults including single stuck-at faults and multiple stuck-at faults in the PLBs without the need for fault simulations.

In general, the exhaustive methods of the present invention detect all faults which do not increase the number of states in the PLBs, such as a bridging fault which introduces feedback. Although most faults which increase the number of states in the PLBs are detected by the present method of testing, the detection of every such fault cannot be guaranteed. This type of exhaustive testing of PLBs is described in complete detail in U.S. application Ser. No. 09/405,958 incorporated herein by reference.

Figure 4A:
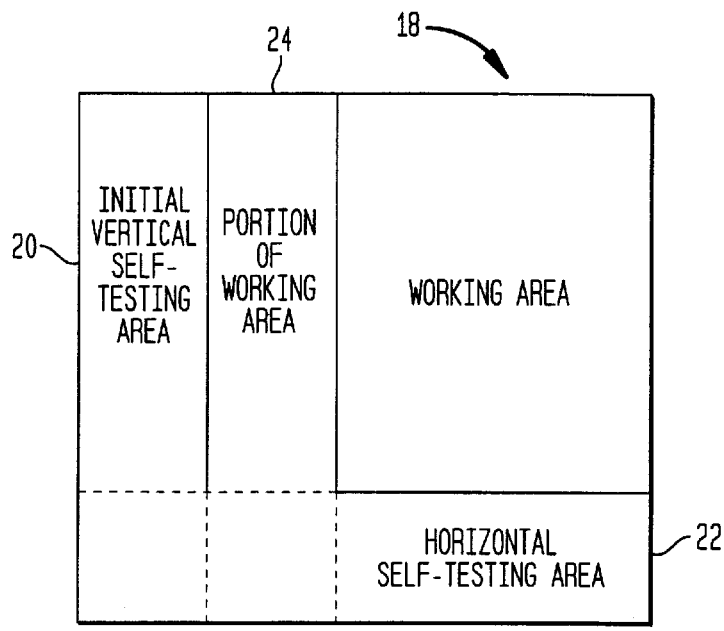
FIGS. 4a and 4b are sequential illustrations showing the roving of the initial self-testing areas of the FPGA under test.
Figure 4B:
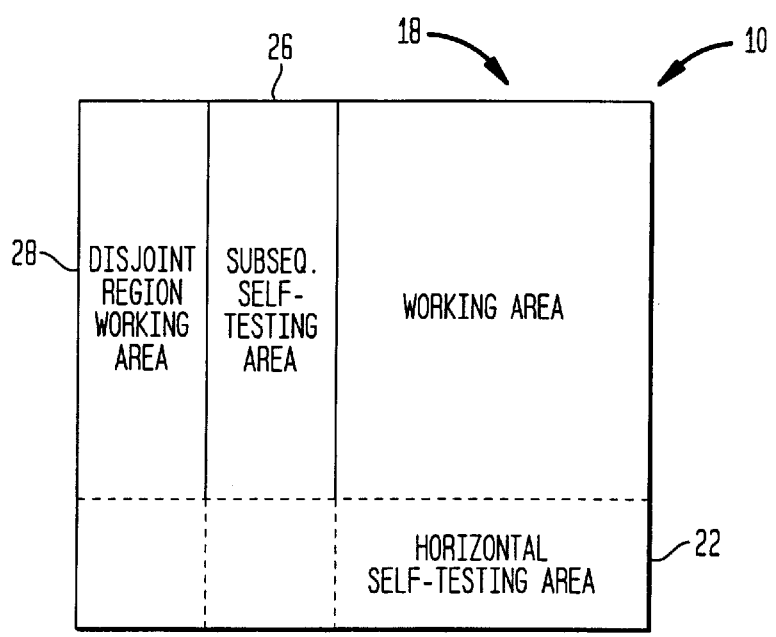

As sequentially shown in FIGS. 4a and 4b, the FPGA under test 10 is reconfigured upon completion of testing of each of the PLBs located within one of the initial self-testing areas (e.g., vertical self-testing area 20) and any necessary incremental reconfiguring of the FPGA under test 10. Specifically, the FPGA under test 10 is reconfigured such that the functions of the PLBs forming the portion 24 of the initial working area 18 are copied to the PLBs forming the initial self-testing area 20. Once completed, the copied portion 24 of the working area 18 becomes a subsequent self-testing area 26 and the initial self-testing area 20 forms a disjoint region 28 of the working area 18 as shown in FIG. 4b. Preferably, the programmed function of an adjacent portion 24 of the working area 18 is relocated or more specifically, copied to the initial self-testing area 20, and the adjacent portion 24 of the working area 18 is then reconfigured as the subsequent self-testing area 26 as shown in FIG. 4b. The present preferred method of roving the self-testing areas and reconfiguring the FPGA under test 10 are described in complete detail in U.S. application Ser. No. 09/405,958 incorporated herein by reference.

Figure 5:
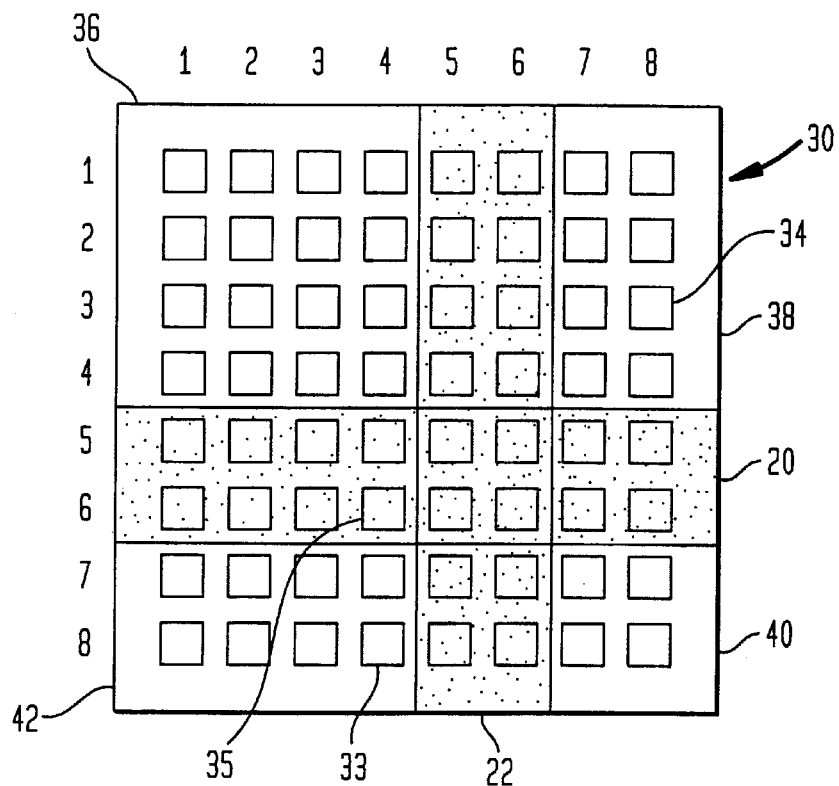
FIG. 5 is an illustration of a physical coordinate system of an FPGA having an 8×8 array of programmable logic blocks divided into horizontal and vertical self-testing areas, and a working area divided into four disjoint regions.

In order to control the system function during testing, roving, and reconfiguring of the FPGA under test 10 in the present preferred embodiment, a physical coordinate system 30 indicative of the entire FPGA and a virtual coordinate system 32 indicative of the working area 18 of the FPGA under test are preferably utilized. As described in greater detail above, the FPGA under test 10 includes an N×N array of PLBs where the physical location of a PLB is given by its row and column. An example physical coordinate system 30 for an FPGA where N=8 is shown in FIG. 5. The location of the horizontal self-testing area 20 is defined by a physical FPGA row i ϵ{1, 3, 5, . . . , N−1} and the location of the vertical self-testing area 22 is defined by a physical FPGA column j ϵ{1, 3, 5, . . . , N−1}. Specifically, the horizontal self-testing area 20 is shown using rows i=5 and i+1=6 and the vertical self-testing area 22 using rows j=5 and j+1=6.

In accordance with techniques well known in the art, the system function of the FPGA is mapped into a set of logic cell functions where each logic cell function is accommodated by a PLB 34 (shown as squares in FIG. 5). Since the FPGA under test 10 in the present preferred method is divided into roving horizontal and vertical self-testing areas 20 and 22 and working area 18 where the system function resides, the locations of the self-testing areas 20 and 22 and the working area 18 periodically change. As discussed more fully above, the working area 18 may be divided by the self-testing areas 20 and 22 into disjoint regions, designated numerals 36, 38, 40 and 42 in FIG. 5. Thus, in order to provide a framework for the system function that is independent of the roving self-testing areas 20 and 22, the virtual coordinate system 32 is utilized to describe the FPGA under test 10 as if the self-testing areas 20 and 22 were not present.

Figure 6:
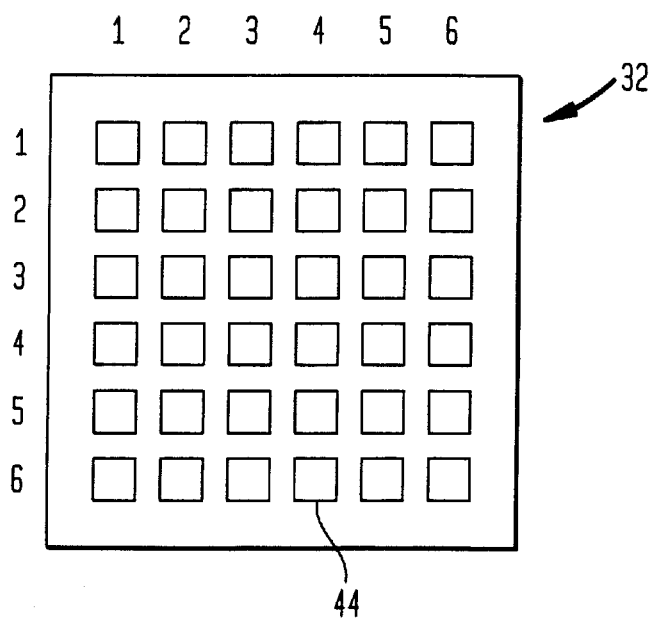
FIG. 6 is an illustration of a virtual coordinate system representative of the divided working area in FIG. 5.

An example virtual coordinate system 32 for an FPGA where N=8 is shown in FIG. 6. The virtual coordinate system 32 is an (N−2)×(N−2) array of virtual logic cells 44 (shown generally as empty squares). In accordance with the present preferred inventive method, the virtual coordinate system 32 or virtual cell array is utilized in mapping, placing, and routing virtual logic cells 44 and in allocating spares. Specifically, the logic cell functions are mapped to virtual logic cells 44, which are subsequently termed working virtual logic cells 46.

A working virtual logic cell 46 may reside in up to four different PLBs within the physical coordinate system 30 depending on the position of the self-testing areas 20 and 22. In other words, as the positions of the self-testing areas 20 and 22 vary, so will the placement of the virtual logic cell 44 within the physical coordinate system 30. For example, virtual logic cell 44 positioned in row 6, column 4 of the virtual coordinate system 32 (shown in FIG. 6) would physically reside in PLB 33 positioned in row 8, column 4 of the physical coordinate system 30 (shown in FIG. 5) due to the present placement of the horizontal self-testing area 20 over PLB 35 in row 6, column 4. Unused virtual logic cells 44 are allocated as spare virtual logic cells 48 which are used for fault tolerant replacement configurations of the FPGA under test 10. In order to accommodate these replacement configurations, reverse mapping is utilized to determine the virtual cells 44 which may occupy the same physical PLB 34 during testing.

Upon detection of at least one faulty PLB in one of the self-testing areas 20 and 22, roving of the self-testing areas 20 and 22 is initially interrupted in order to isolate the faulty PLBs and to identify their faulty mode(s) of operation. The faulty mode(s) of operation are recorded as fault status data by the controller 12 and stored in memory 14 for later use in reconfiguring partially faulty PLBs to continue performing non-faulty system functions or in reconfiguring the FPGA under test 10 to avoid the faulty PLBs altogether. The present preferred method of isolating faulty PLBs and detecting their faulty mode(s) of operation is described in complete detail in U.S. Provisional Application No. 60/156,189 incorporated herein by reference.

Having isolated the faulty PLBs and determined their faulty mode(s) of operation, the next steps in accordance with the present preferred inventive method is to continue normal system operation within the working area 18 and testing within one or preferably both of the self-testing areas 20 and/or 22. If the isolated faulty PLBs are located within a two row by two column group of PLBs, i.e., if the faulty PLBs may be contained entirely within either of the self-testing areas 20 and 22, then either self-testing area 20 or 22 may continue to rove/test. In this manner, both self-testing areas 20 and 22 may continue to rove/test in an alternating fashion so long as one of the self-testing areas 20 or 22 covers the isolated faulty PLBs until a suitable reconfiguration of the FPGA under test 10 is completed. Advantageously, this allows for complete testing of the PLBs of the FPGA under test 10 to continue during the reconfiguration process. If the isolated faulty PLBs are not located within a two row by two column group of PLBs, i.e., the faulty PLBs can only be covered by the self-testing area originally used to detect the faults, then this particular self-testing area must temporarily remain stationary while further roving and testing of PLBs continues in the remaining self-testing area.

As noted above, the fault status data (indicative of the faulty mode(s) of operation of the PLBs) is first utilized to reconfigure partially faulty PLBs to continue performing non-faulty system functions. Since a partially faulty PLB may be hosted by up to four different PLBs within the working area 18 having different functional requirements, the partially faulty PLB must be able to perform the required function of each possible PLB. If the partially faulty PLB can correctly perform the required functions of each possible PLB using its fault-free modes of operation, then no replacement or spare PLB is needed. If the partially faulty PLB has faulty flip-flops, for example, it may be used as a partially usable PLB whenever the system function to be performed by the partially faulty PLB is combinational or uses the LUT/RAM module as RAM. If all of the isolated partially faulty PLBs can serve as partially faulty PLBs for all four of their respective possible PLB functions (dependent upon the placement of the self-testing areas), then no changes to the FPGA under test 10 are needed and the roving/testing process is allowed to proceed.

Advantageously, by reconfiguring partially faulty PLBs affected by faults detected during testing, the partially faulty logic blocks are allowed to continue to operate in a progressively diminished, although acceptable, capacity for specific operating modes. This type of fault tolerant operation of PLBs is described in complete detail in U.S. application Ser. No. 09/261,776 incorporated herein by reference.

Prior to relocating either of the initial self-testing areas 20 or 22, the FPGA under test 10 and specifically the initial self-testing area which is to become a portion of the working area 18 must be reconfigured to avoid any unusable faulty PLBs being used by the system function. In accordance with the broadest aspects of the present inventive method, a subset of the PLBs within the working area 18 are initially allocated as spares having predetermined or precomputed replacement configurations for each associated working PLB. Preferably, each spare PLB is initially constrained to be in the same two-row or two-column portion of the working area 18 as the unusable faulty PLB to be replaced. In this manner, fault tolerant reconfiguration may be accomplished together with the relocation of the self-testing area by merging the two partial configurations in a known manner.

In accordance with the present preferred method, allocation of spares is accomplished utilizing the above described virtual coordinate system 32 to distribute the spare virtual logic cells 48 evenly throughout the FPGA under test 10 while trying to minimize the distance between these spares and the working virtual logic cells 46 they may have to replace when the PLB in which the respective logic function resides becomes faulty and unusable. In this manner, every two-row or two-column portion of the working area 18 includes spare PLBs.

Figure 7:
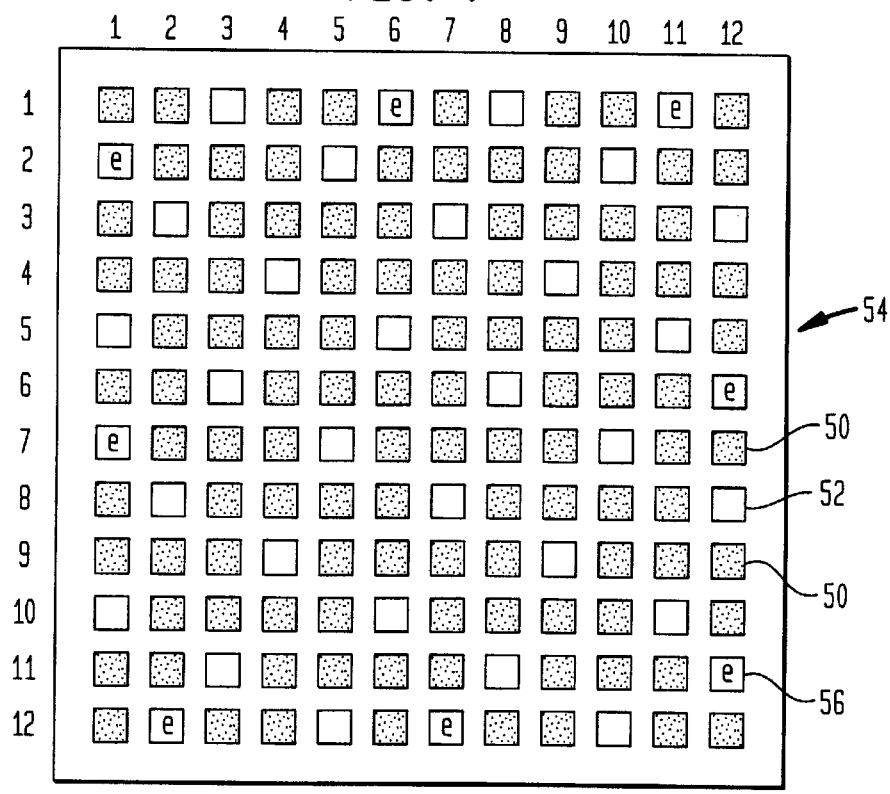
FIG. 7 is an illustration of a contiguous 12×12 working area of an FPGA showing the preferred allocation of spare programmable logic blocks.

In the most preferred case, shown in FIG. 7, at least one spare PLB 52 (shown as empty squares) is placed adjacent to each PLB being used by the system function or working PLB 50 (shown as filled squares). This is always possible when at least twenty percent of the virtual logic cells 44 in the virtual coordinate system 32 are reserved as virtual spares 48. In other words, if the working area PLB utilization in the FPGA under test 10 is less than eighty percent, every working PLB 50 is able to be placed adjacent to at least one spare PLB 52.

To accomplish this distribution, the design of the FPGA is constrained so that at least twenty percent of the working area PLBs are left as spare PLBs. As is well known in the art, this is not excessive, since typical PLB utilization is less than eighty percent even for non-fault tolerant applications because higher utilizations make the design difficult to route. If this constraint is satisfied, the logic cell functions converted from system functions may be mapped such that every working PLB 50 is positioned adjacent to at least one spare PLB 52. FIG. 7 illustrates such placement in a contiguous 12×12 working area 54 of an FPGA.

Figure 8:
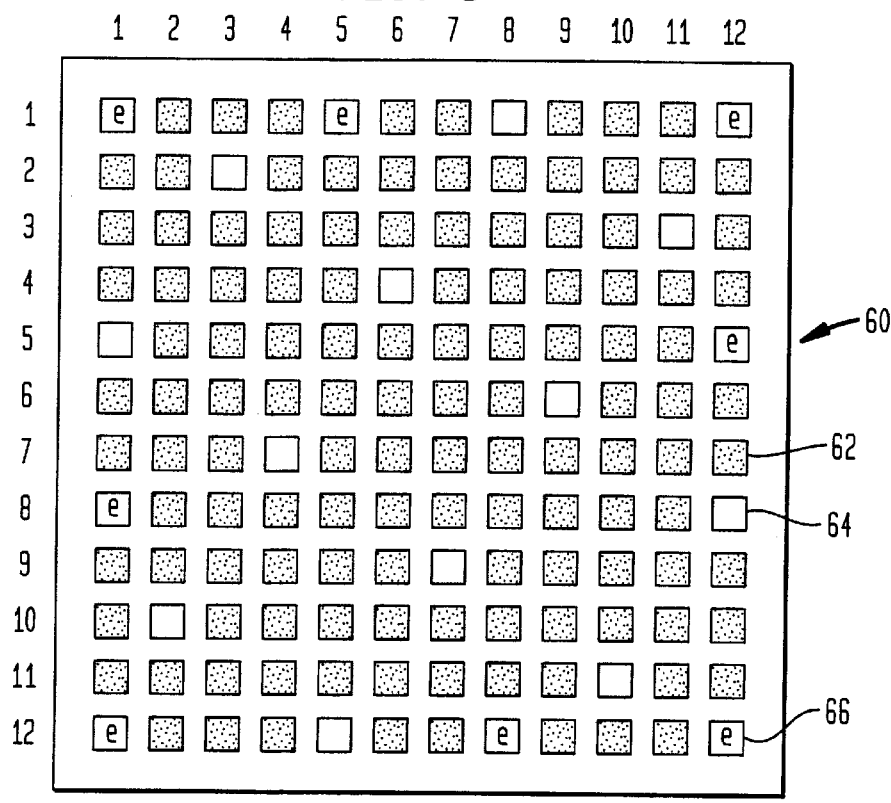
FIG. 8 is an illustration of a contiguous 12×12 working area of an FPGA showing an alternate allocation of spare programmable logic blocks.

To force standard design tools to generate evenly distributed spare PLBs, the location of the spare PLBs 52 is initially reserved by preplacing dummy PLBs before executing a standard placement algorithm. For each working PLB 50, an adjacent spare PLB 52 is selected as its preferred replacement and a corresponding fault tolerant reconfiguration is precomputed before the mission starts. As shown in FIG. 7, additional edge spare PLBs 56 (shown as squares enclosing a lower case e) are needed along the edges of the working area 54 to ensure that all working PLBs 50 positioned along the edges of the working area 54 also have adjacent spare PLBs whether the adjacent spare PLBs are spare PLBs 52 or edge spare PLBs 56. Of course, alternative spare PLB allocation configurations may be utilized in accordance with the broadest teachings of the present invention. For example, FIG. 8 illustrates the above concepts but for a contiguous 12×12 working area 60 having a PLB utilization of less than ninety-two percent. In this alternate scenario, each working PLB 62 is no further than one working PLB 62 from a spare PLB 64 or edge spare PLB 66.

After an unusable PLB has been replaced by its pre-allocated replacement spare PLB, the remaining precomputed fault tolerant replacement configurations relying on the same replacement spare PLB become invalid since that particular spare is no longer available and must be recomputed.

Similarly, if the number or location of unusable faulty PLBs in the self-testing area is such that the initially allocated spare PLBs and their attendant precomputed fault tolerant replacement configurations cannot be used, then a subsequent portion of the PLBs located within the working area must be allocated as spare PLBs to ensure that all faulty PLBs have non-conflicting spare PLB replacements. If the remaining working PLBs have other adjacent and unused spare PLBs within the same portion of the working area, then one of those spare PLBs is selected as a new preferred spare PLB and a new fault tolerant replacement configuration computed. These computations are done by the controller 12 during subsequent roving/testing. Again, the computation time is not critical to the overall system operation since the fault tolerant replacement configurations will be needed only after the occurrence and detection of the next fault.

If there are no other adjacent spare PLBs, a spare PLB closest to the remaining working PLB within the same portion of the working area is used. This is accomplished by shifting the working PLB and its working neighbors positioned between the working PLB and the closest unused spare PLB toward the closest unused spare PLB. In this manner, a new spare PLB is created for possible use in replacing the working PLB if it is determined to be faulty and unusable. The shifting of PLBs is accomplished through an incremental reconfiguration as described in detail above.

Although the initial precomputed fault tolerant replacement configurations are preferred over real-time computations of replacement configurations due to time considerations, the additional time required to reallocate subsequent spare PLBs and compute new replacement configurations does not significantly interfere with the continuing operation of the FPGA. As noted above, normal operation of the FPGA continues within the working area and some testing may continue in the remaining self-testing area throughout the reallocation of the subsequent spare PLBs and the computation of the fault tolerant replacement configurations.

In accordance with the present inventive method described above, subsequent self-testing areas are similarly exhaustively tested and fault status data for each PLB generated. Further, the steps of testing and reconfiguring each PLB within the subsequent testing areas are then repeated. This continues until each portion of the working area 18, or the entire FPGA under test 10, is reconfigured as a subsequent self-testing area and its PLBs tested and all faulty PLBs isolated, identified, and the FPGA under test 10 reconfigured for fault tolerant operation if required. In other words, the self-testing areas continuously rove around the FPGA under test 10 repeating the steps of testing the PLBs and reconfiguring the FPGA under test 10 so long as the FPGA 10 is in operation. Again, normal operation of the FPGA under test 10 continues uninterrupted by the ongoing testing conducted within the self-testing areas.

As the self-testing areas rove around the FPGA under test 10 repeating the steps of testing the PLBs and reconfiguring the FPGA, the number of spare PLBs will inevitably diminish over time as unusable faulty PLBs are replaced. In accordance with another important aspect of the present invention, additional spare PLBs are then allocated from the self-testing areas and the necessary fault tolerant replacement configurations computed for use in replacing the unusable faulty PLBs. Necessarily, therefore, the testing and roving capabilities of the self-test areas are also inevitably diminished until at some point, roving, testing, and eventually operation of the FPGA under test 10 will cease. Preferably, the spare PLBs from the self-testing areas are selected such that at least one self-testing area is able to continue roving and testing for as long as possible.

In summary, the method of fault tolerant operation utilizing incremental reconfiguration is carried out during normal on-line operation of the FPGA under test 10 by configuring the FPGA resources into a working area 18 and self-testing areas 20 and 22. The working area 18 maintains normal operation of the FPGA under test 10 throughout testing of the PLBs and reconfiguring of the FPGA. Within the initial and subsequent self-testing areas, the PLBs are exhaustively tested, and their utilization adjusted, if required. Unusable PLBs are incrementally replaced with spare PLBs. Preferably, the spare PLBs are selected from a portion of the working area PLBs allocated as preferred spare PLBs, a subsequent portion of the working area PLBs allocated as spare PLBs as needed, and last from PLBs within one or both of the self-testing areas. Accordingly, the present inventive method of fault tolerant on-line operation utilizing incremental reconfiguration delays the need for real-time computation of fault tolerant replacement configurations, and the subsequent use of PLBs from the self-testing areas as spares for as long as possible while maintaining normal operation of the FPGA under test 10.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fault tolerant operation of a field programmable gate array utilizing incremental reconfiguration during normal on-line operation comprising the steps of:

configuring said field programmable gate array into an initial self-testing area and a working area, said working area maintaining normal operation of the field programmable gate array;

testing at least one programmable logic block located within said self-testing area for faults;

determining a new configuration of the field programmable gate array as a function of a result of said testing step utilizing at least one spare programmable logic block to replace at least one programmable logic block determined to be faulty during said testing step; and reconfiguring at least a portion of said field programmable gate array in accordance with said new configuration.

2. The method set forth in claim 1 further comprising the step of allocating at least one programmable logic block of the field programmable gate array within said working area as a spare.

3. The method set forth in claim 2, wherein the step of determining a new configuration of the field programmable gate array includes precomputing at least one new configuration for said field programmable gate array for each allocated spare; and selecting one of said new configurations as a function of the result of said testing step.

4. The method set forth in claim 3, wherein the step of allocating at least one spare includes selecting said at least one spare programmable logic block from said working area such that each of the remaining programmable logic blocks of said working area are located adjacent to said at least one spare.

5. The method set forth in claim 4, wherein the step of allocating at least one spare includes designating said at least one spare as a preferred spare for each adjacent programmable logic block.

6. The method set forth in claim 2, further comprising the step of reallocating at least one subsequent programmable logic block of the field programmable gate array within said working area as a spare when a new configuration is unable to be determined; and determining at least one additional new configuration of the field programmable gate array as a function of the result of said testing step utilizing said at least one subsequent spare to replace said at least one faulty programmable logic block.

7. The method set forth in claim 6, wherein said reconfigured portion of the field programmable gate array is initially limited to a portion of the field programmable gate array adjacent to said at least one faulty programmable logic block; and enlarging said initially limited portion of the field programmable gate array until said reconfiguration step is complete.

8. The method set forth in claim 2, further comprising the step of utilizing at least one programmable logic block of the field programmable gate array within said self-testing area as a spare after substantially exhausting said working area spares.

9. A method of fault tolerant operation of a field programmable gate array utilizing incremental reconfiguration during normal on-line operation comprising the steps of:

configuring said field programmable gate array into two initial self-testing areas and a working area, said working area maintaining normal operation of the field programmable gate array;

allocating at least one programmable logic block of said working area as a spare;

testing programmable logic blocks located within at least one of said initial self-testing areas for faults;

determining a new configuration of the field programmable gate array utilizing a result of said testing step and said at least one spare; and reconfiguring at least a portion of the field programmable gate array in accordance with said new configuration.

10. The method set forth in claim 9, wherein the testing step includes isolating at least one programmable logic block determined to be faulty during said testing step;

detecting the existence of at least one faulty mode of operation of said isolated faulty programmable logic block; and wherein said reconfiguring step is carried out only if said detected faulty mode of operation prevents the programmed operation of at least one of said faulty programmable logic blocks, whereby partially faulty programmable logic blocks may be further utilized to provide fault tolerant operation of the field programmable gate array.

11. The method set forth in claim 10, further comprising the step of reconfiguring the field programmable gate array such that a portion of said working area becomes a subsequent self-testing area and at least a portion of said initial self-testing area becomes a portion of said working area.

12. The method set forth in claim 11, wherein the steps of testing said programmable logic blocks, isolating said faulty programmable logic blocks, and reconfiguring the field programmable gate array are continuously repeated.

13. The method set forth in claim 9, further comprising the steps of subdividing at least one of said initial self-testing areas into self-testing tiles;

separately testing programmable logic blocks located within said self-testing tiles to isolate at least one faulty programmable logic block;

repeating the steps of subdividing and separately testing until said at least one faulty programmable logic block is isolated;

applying test patterns to said at least one isolated programmable logic block sufficient to detect the existence of at least one faulty mode of operation; and wherein said reconfiguring step is carried out only if said detected faulty mode of operation prevents the programmed operation of said at least one isolated programmable logic block, whereby partially faulty programmable logic blocks may be further utilized to provide fault tolerant operation of the field programmable gate array.

14. The method set forth in claim 9, wherein the step of allocating at least one spare includes selecting said spare programmable logic block from said working area such that each of the remaining programmable logic blocks of said working area are located adjacent to said at least one spare.

15. The method set forth in claim 14, wherein the step of determining a new configuration of the field programmable gate array includes precomputing at least one new configuration for said field programmable gate array for said at least one spare; and selecting one of said new configurations as a function of the result of said testing step.

16. The method set forth in claim 15, wherein the step of allocating at least one spare includes designating said spare as a preferred spare for each adjacent programmable logic block.

17. The method set forth in claim 15, further comprising the step of reallocating at least one subsequent programmable logic block of the field programmable gate array within said working area as a spare when a new configuration is unable to be determined; and determining at least one additional new configuration of the field programmable gate array utilizing said at least one subsequent spare to replace said at least one faulty programmable logic block.

18. The method set forth in claim 14, further comprising the steps of determining if two of said faulty programmable logic blocks are allocated to the same preferred spare; and reallocating at least one subsequent programmable logic block of said field programmable gate array within said working area as a spare when a new configuration is unable to be determined.

19. The method set forth in claim 18, wherein said reconfigured portion of the field programmable gate array is initially limited to a portion of the field programmable gate array nearest said at least one faulty programmable logic block; and enlarging said initially limited portion of the field programmable gate array to accommodate said reconfiguration step.

20. The method set forth in claim 9, further comprising the step of allocating at least one programmable logic block of the field programmable gate array within at least one of said initial self-testing areas as a spare; and utilizing said at least one self-testing area spare in said determining step.

21. A method of fault tolerant on-line operation of a field programmable gate array utilizing incremental reconfiguration comprising the steps of:

configuring the field programmable gate array into an initial self-testing area and a working area, said working area maintaining normal operation of the field programmable gate array;

testing at least one programmable logic block located within said self-testing area for faults; and reconfiguring the field programmable gate array as a function of a result of said testing step to replace at least one programmable logic block determined to be faulty during said testing step utilizing at least one programmable logic block of the field programmable gate array that had been allocated as a spare;

said at least one spare preferably selected from said initial working area and then said self-testing area.

22. The method set forth in claim 21, wherein the testing step includes isolating said at least one faulty programmable logic block;

detecting the existence of at least one faulty mode of operation of said isolated faulty programmable logic block; and wherein said reconfiguring step is carried out only if said detected faulty mode of operation prevents the programmed operation of at least one of said faulty programmable logic blocks, whereby partially faulty programmable logic blocks may be further utilized to provide fault tolerant operation of the field programmable gate array.

23. The method set forth in claim 22, further comprising the step of determining at least one new configuration of the field programmable gate array utilizing said at least one spare programmable logic block for use in said reconfiguring step.

24. An apparatus for testing programmable logic blocks of a field programmable gate array and supporting fault tolerant on-line operation of the field programmable gate array utilizing incremental reconfiguration comprising:

a controller in communication with the field programmable gate array for (a) configuring said field programmable gate array into an initial self-testing area and a working area, said working area maintaining normal operation of the field programmable gate array, (b) for testing the programmable logic blocks located within said self-testing area for faults, (c) determining a new configuration of the filed programmable gate array as a function of a result of testing utilizing at least one spare programmable logic block to replace at least one programmable logic block determined to be faulty, and (d) reconfiguring at least a portion of the field programmable gate array in accordance with said new configuration.

25. The apparatus for testing programmable logic blocks of a field programmable gate array and supporting fault tolerant on-line operation of the field programmable gate array utilizing incremental reconfiguration of claim 24, further comprising a storage medium in communication with said controller for storing a plurality of test configurations, usage and fault status data for each programmable logic block under test, and new configurations.

26. A field programmable gate array comprising:

a plurality of programmable logic blocks;

a plurality of programmable logic blocks routing resources interconnceting said programmable logic blocks;

said programmable logic blocks and said programmable routing resources being initially configured as at least one initial self-testing area for testing said programmable logic blocks within said self-testing area, and an initial working area for maintaining normal operation of the field programmable gate array during testing and incremental reconfiguration of the field programmable gate array; and said programmable logic blocks and said programmable routing resources being subsequently reconfigured as a result of said testing utilizing at least one spare programmable logic block to replace at least one programmable logic block determined to be faulty during said testing step.

* * * * *